(12) United States Patent
Iri (10) Patent No.: US 8,316,744 B2
(45) Date of Patent: Nov. 27, 2012

(54) DICING METHOD, PROGRAM FOR THE DICING METHOD, AND STORAGE MEDIUM FOR THE DICING METHOD

(75) Inventor: Junichiro Iri, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 661 days.

(21) Appl. No.: 12/487,508

(22) Filed: Jun. 18, 2009

(65) Prior Publication Data
US 2009/0314144 A1 Dec. 24, 2009

(30) Foreign Application Priority Data

Jun. 23, 2008 (JP) ................... 2008-163635

(51) Int. Cl.
*B26D 1/00* (2006.01)
*B26D 5/00* (2006.01)
(52) U.S. Cl. ............................................. 83/13; 83/73

(58) Field of Classification Search ............... 83/13, 73, 83/72; 438/462, 460, 465, 8, 14, 16, 148; 257/48, 797, 460, 462
See application file for complete search history.

(56) References Cited

U.S. PATENT DOCUMENTS

| 4,178,820 A | * | 12/1979 | Gerber | 83/13 |
| 5,164,019 A | * | 11/1992 | Sinton | 136/249 |
| 2007/0023932 A1 | * | 2/2007 | Sogawa et al. | 257/797 |

FOREIGN PATENT DOCUMENTS

| JP | 11-204462 | 7/1999 |
| JP | 2004-288961 | 10/2004 |

* cited by examiner

*Primary Examiner* — Ghassem Alie
(74) *Attorney, Agent, or Firm* — Canon U.S.A., Inc. IP Division (57) ABSTRACT

A dicing method includes the step of cutting a substrate with a blade along a scribe line free from metal before an inclination of the blade surface reaches a predetermined critical value. The blade surface becomes inclined when the blade cuts into a scribe line having metal thereon. The critical value is determined on the basis of the inclination of the blade surface which leads to a breakage of the blade.

5 Claims, 12 Drawing Sheets

DICING METHOD, PROGRAM FOR THE DICING METHOD, AND STORAGE MEDIUM FOR THE DICING METHOD

BACKGROUND OF THE INVENTION

1. Field of the Invention

The present invention relates to a dicing method for forming a groove in a substrate or cutting a substrate, a program for the dicing method, and a storage medium for the dicing method.

2. Description of the Related Art

According to an example of a general dicing method, a rotating blade is used to cut a patterned substrate along a plurality of scribe lines successively from an end of the substrate. Thus, chips are separated from each other.

In this process, there may be a case in which metal deposit is provided on the scribe lines depending on an exposure method. For example, in the case where semiconductor devices are formed on a semiconductor substrate, such as a silicon substrate, an exposure device called a stepper performs an exposure process in which a circuit pattern drawn on a reticle is projected onto a surface of the substrate in a reduced size.

Figure 12:
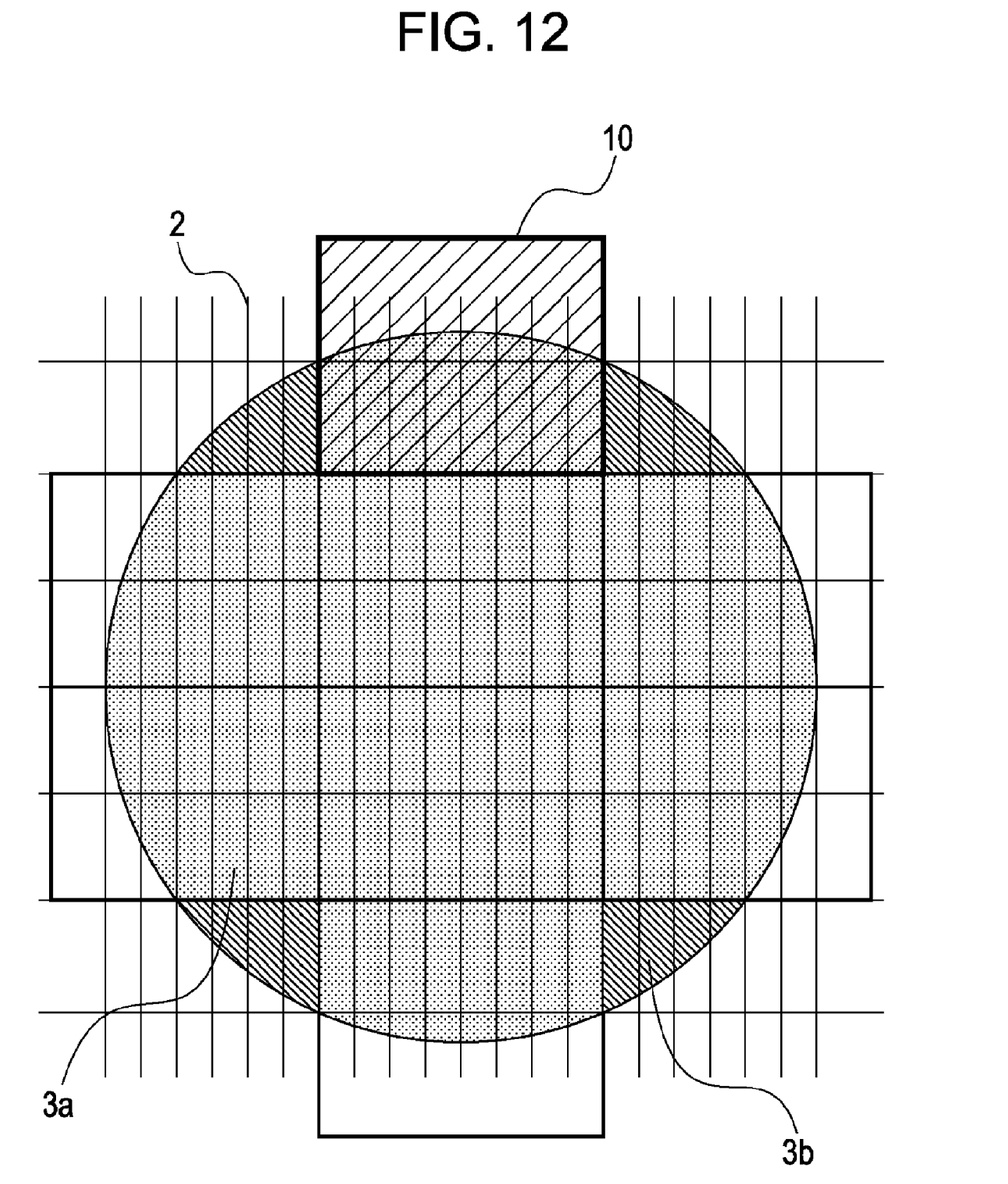
FIG. 12 is a schematic diagram illustrating a silicon substrate having an unexposed portion and an exposed portion formed when a stepper is used.

In this process, a circuit pattern corresponding to a single chip or a plurality of chips is formed by a single step of exposure. Thus, an exposure area 10 corresponding to a single shot is formed on the surface of the substrate (see FIG. 12). Then, the exposure position on the surface of the substrate is moved to the next chip (or the next group of chips), and the exposure step is performed again. These steps are repeated so that a plurality of rectangular exposure areas 10 are formed next to one another on the surface of a single substrate. Referring to FIG. 12, in outermost peripheral areas in which only incomplete elements (elements positioned near the edge of the substrate and cannot be formed completely) can be formed, the exposure step is not performed. Consequently, the unexposed areas are left unetched. Therefore, the metal deposit made of, for example, aluminum, remains.

In such a case, if the semiconductor substrate on which the metal deposit remains on the scribe lines is cut along the scribe lines successively from an end of the substrate, the cutting performance will be gradually reduced and the cutting position will be displaced accordingly. In addition, in the case where a particularly large amount of metal deposit remains on the scribe lines, there is a risk that the blade will break in an early stage of the cutting process. For example, if a plurality of substrates are successively cut with a blade by more than 40 mm along scribe lines on which the metal deposit is provided, there a risk that the blade will break after cutting several substrates.

If the cutting performance of an edge of the blade is reduced, it is necessary to perform a process of cutting a dressing member with the blade so that the edge of the blade can be unclogged and diamond abrasive grain on the surface of the edge can be removed to expose new diamond abrasive grain inside the edge. Thus, the cutting performance of the edge of the blade is restored by cutting the dressing member with by the blade. This process is called dressing.

Normally, an operator manually places the dressing member on a suction table for receiving the substrate, that is, an object to be processed. However, Japanese Patent Laid-Open No. 11-204462 discusses a dicing device including a conveying unit which automatically conveys the dressing member to the suction table.

Japanese Patent Laid-Open No. 2004-288961 discusses a dicing method in which the dressing member is placed next to the substrate on a dicing tape and the blade is caused to cut into the dressing member before or after cutting the substrate, so that reduction in the cutting performance of the blade can be suppressed.

However, according to the dicing device described in Japanese Patent Laid-Open No. 11-204462, if it becomes necessary to perform the dressing process in the process of cutting the substrate, the process of cutting the substrate must be temporarily stopped. Then, the substrate is removed from the suction table, and the dressing member is placed on the suction table. After the dressing process, the substrate must be placed on the suction table and positioned again. In the case where the substrate is precisely processed, the substrate must be precisely positioned when the cutting process is restarted. In addition, it requires extra time to place and remove the substrate and the dressing member and to redo the positioning of the substrate.

In addition, it is difficult to apply the dicing method of Japanese Patent Laid-Open No. 11-204462 to circular substrates, such as common silicon wafers. In addition, since the dressing member must be placed on the dicing tape in an area free from the substrate, a space for placing the dressing member is necessary.

SUMMARY OF THE INVENTION

The present invention has been made in view of the above-described circumstances, and provides a method for cutting a substrate while suppressing a reduction in cutting performance a blade and preventing breakage of the blade without performing a process for restoring the cutting performance of the blade by removing the substrate in the cutting process and without using a dressing member which requires an additional accommodation space.

According to an aspect of the present invention, a dicing method includes providing a substrate including a scribe line having a metal film thereon and a scribe line free from the metal film; starting a process of cutting the substrate with a blade along the scribe line having the metal film thereon; and cutting the scribe line free from the metal film before a bending amount by which a surface of the blade is bent when the blade cuts along the scribe line having the metal film thereon reaches a critical value calculated in advance on the basis of a bending amount of the surface of the blade which leads to a breakage of the blade, so that the substrate is cut along the scribe line free from the metal film while the bending amount of the surface of the blade is smaller than the bending amount by which the surface of the blade is bent when the blade cuts along the scribe line having the metal film thereon.

According to the present invention, reduction in the cutting performance can be suppressed and breakage of the blade can be prevented without removing the substrate in the cutting process and without using an additional space.

Further features of the present invention will become apparent from the following description of exemplary embodiments with reference to the attached drawings.

DESCRIPTION OF THE EMBODIMENTS

First Embodiment

A dicing method according to the present invention will be described with reference to FIGS. 1A and 1B.

Figure 1A:
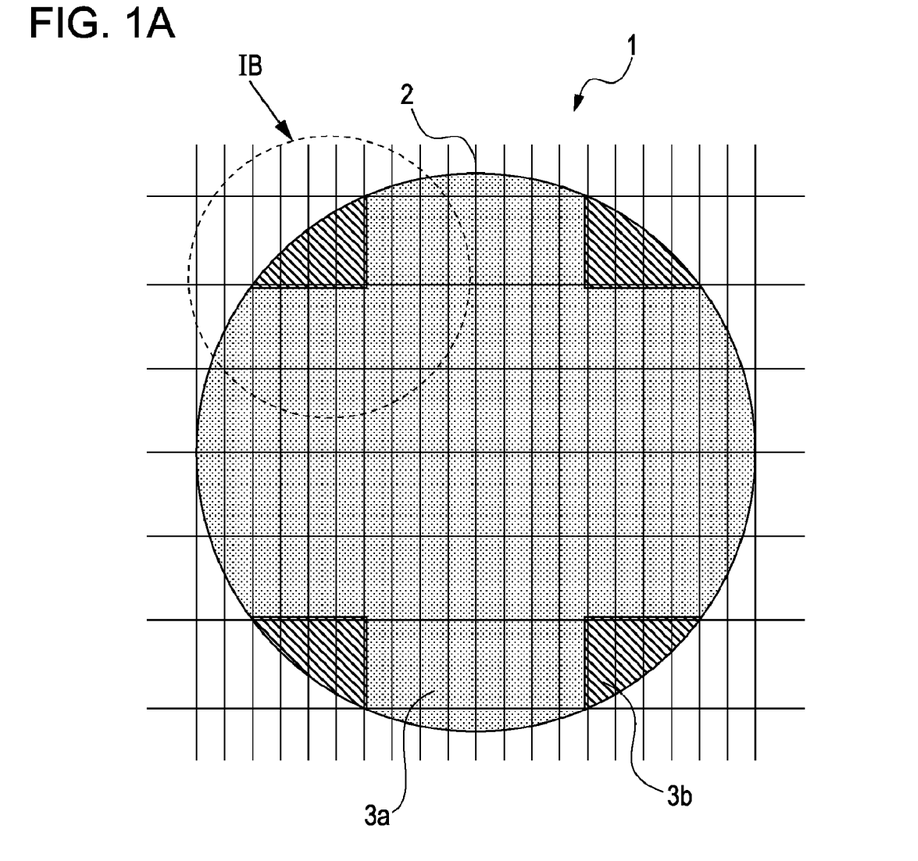
FIGS. 1A and 1B are schematic diagrams illustrating a silicon substrate having areas in which metal deposit is provided on scribe lines and an area in which no metal deposit is provided on the scribe lines.

FIG. 1A is a diagram illustrating an exposed portion and unexposed portions of resist provided on a silicon substrate 1, which serves as a semiconductor substrate, when semiconductor devices are formed on the silicon substrate 1 using a stepper.

Figure 1B:
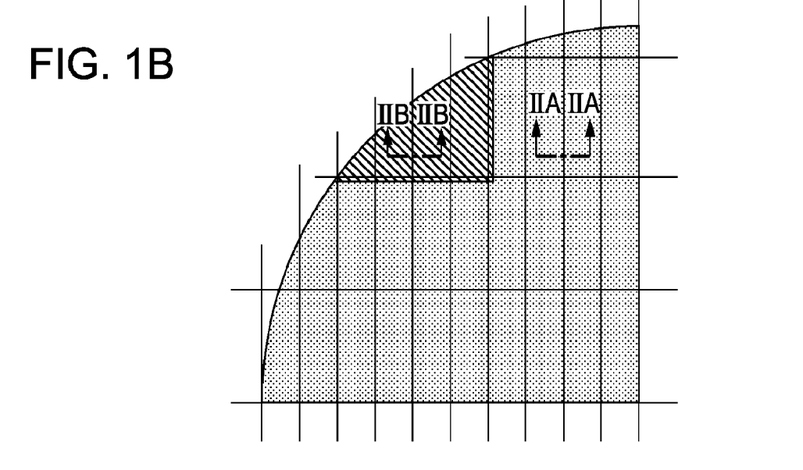
Figure 2A:
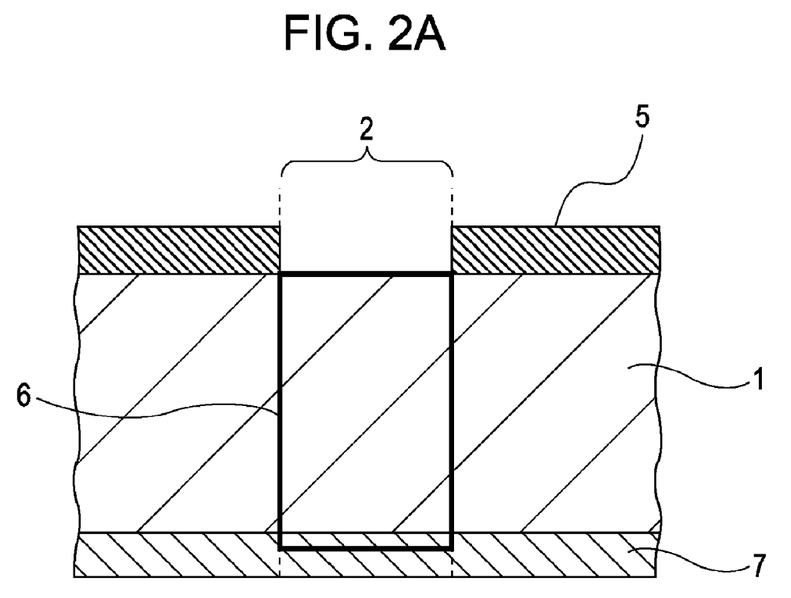
FIGS. 2A and 2B are sectional views of FIG. 1B taken along lines IIA-IIA and IIB-IIB, respectively.
Figure 2B:
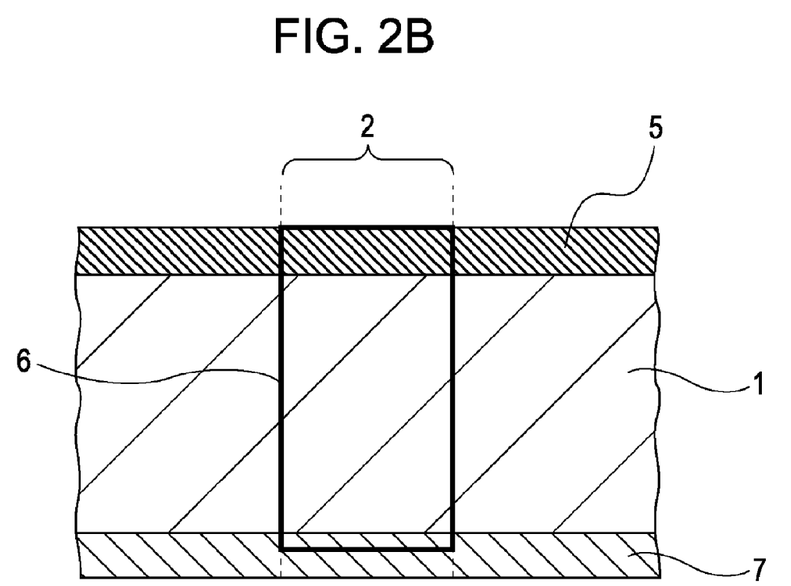

FIG. 1B is an enlarged view of part IB in FIG. 1A. FIGS. 2A and 2B are sectional views of FIG. 1B taken along lines IIA-IIA and IIB-IIB, respectively.

The resist disposed in an area 3a is subjected to exposure. Therefore, in the area 3a, the resist is removed and metal deposit 5 made of aluminum or the like on scribe lines 2 is exposed and removed in an etching process. Thus, the metal deposit 5 which covers a cutting section 6 which is to be removed when the silicon substrate 1 is cut by a blade 8 is removed in the etching process. Referring to FIG. 2A, the metal deposit 5 forms a metal film which functions as wires in a circuit pattern of each semiconductor device. In contrast, the resist disposed in areas 3b is not exposed. Since the resist remains on the metal deposit 5 on the scribe lines 2 in the etching process, the metal deposit 5 is not removed in the etching process. Therefore, as shown in FIG. 2B, the metal deposit 5 remains on the scribe lines 2. Thus, the metal deposit 5 which covers the cutting section 6 remains in the form of a metal film. The metal film is made of, for example, aluminum or gold used for forming the above-mentioned wires, Ta used for forming a protecting layer for the circuit pattern, and other noble metals. Although the metal deposit 5 is explained as an example, the metal film can also be formed by painting, plating, etc., instead of deposition.

To confirm the influence of the metal deposit 5 provided on the scribe lines 2, the inventors of the present invention performed the following examination.

Figure 3A:
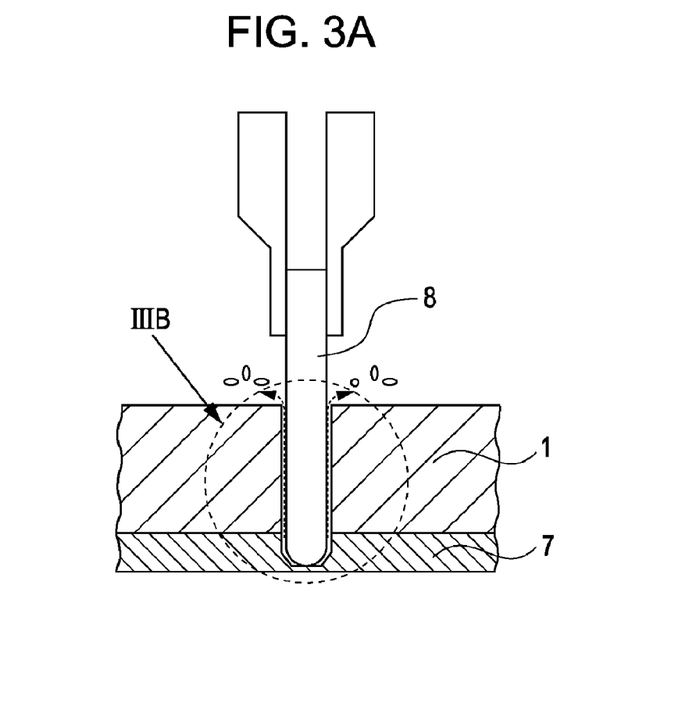
FIGS. 3A and 3B are schematic diagrams illustrating a process of cutting a silicon substrate with a blade.
Figure 3B:
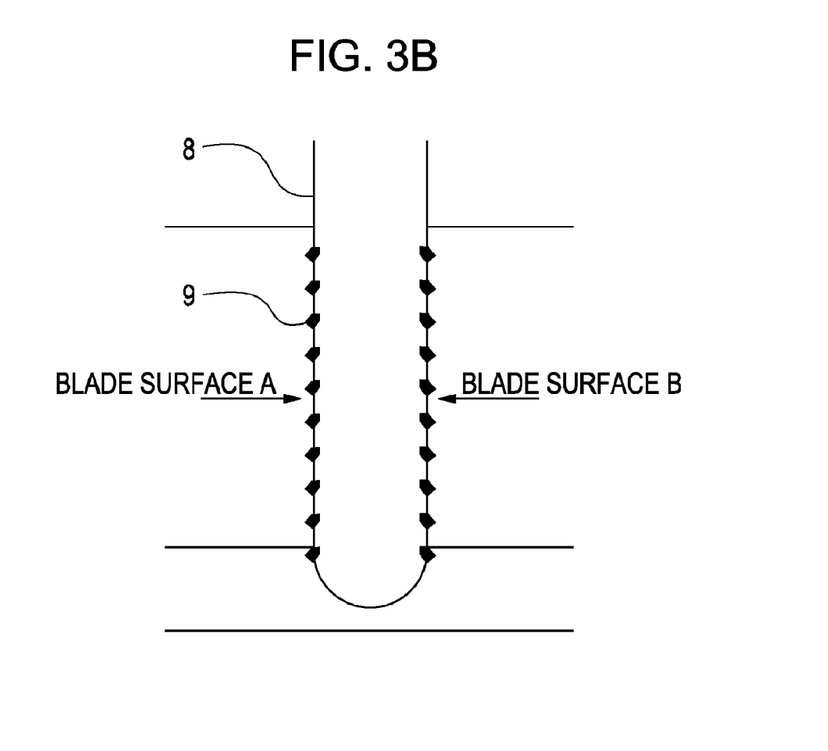

That is, first, the silicon substrate 1 which is free from the metal deposit 5 on the scribe lines 2 was cut by the blade 8, and the blade 8 was observed after the cutting process. FIG. 3A is a schematic diagram illustrating an end portion of the blade 8 in the cutting process viewed in a direction in which the blade 8 is moved. FIG. 3B is an enlarged view of part IIIB in FIG. 1A.

It is difficult to make amounts of projections (amounts of dressing) of diamond abrasive grain 9 on both sides of the blade 8 equal to each other, and the amount of dressing somewhat differs between the side surfaces of the blade 8, as shown in FIG. 3B. Due to the difference in the amount of dressing, the cutting performance of the blade 8 differs between the side surfaces thereof.

Figure 4A:
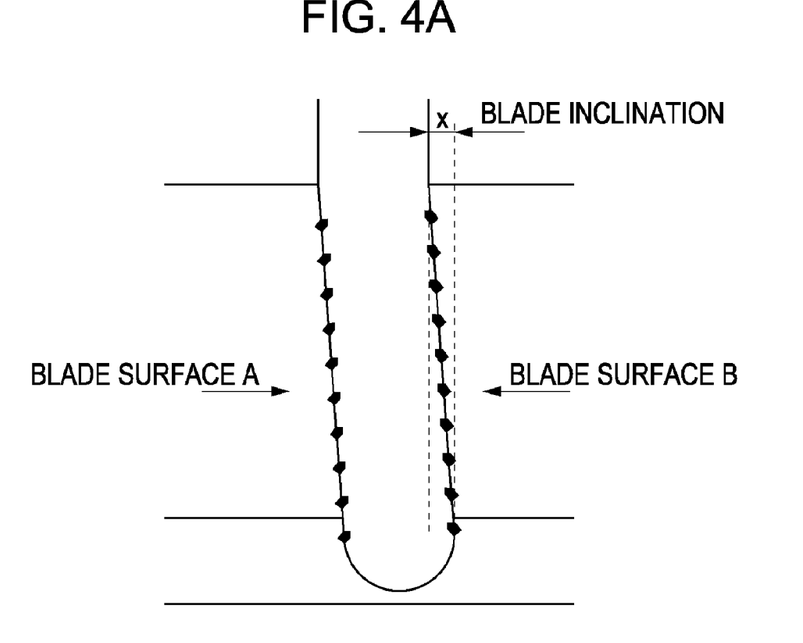
FIGS. 4A and 4B are schematic diagrams illustrating the inclination of the blade in the process of cutting the silicon substrate with the blade.

For example, in the case where the amount of dressing of a blade surface B is larger than that of a blade surface A, the cutting performance of the blade surface B is higher than that of the blade surface A. A dicing process was performed using such a blade, and it was found that when the blade cuts into the silicon substrate, the end portion of the blade tends to slightly incline toward the blade-surface-B side, as shown in FIG. 4A. In addition, an inclination of the scribe lines 2 in the cross section thereof was measured after the dicing process, and it was found that a portion of the blade 8 which is not in contact with the silicon substrate 1 (portion which does not cut into the silicon substrate 1) is not inclined and only the portion of the blade 8 which cuts into the silicon substrate 1 is inclined.

For example, a 6-inch silicon substrate with a thickness of 625 μm was used as the silicon substrate 1 and was fully cut along 500 lines using a blade produced by DISCO Corporation (Model No. NBC-ZH205O) as the blade 8. As a result, the blade 8 was inclined by about 10 μm. The feed rate of the blade 8 was about 30 mm/sec and the rotational speed thereof was 45000 rpm. The inclination hardly varied when only the silicon substrate 1 free from the metal deposit 5 was cut. Here, the term "inclination" means the maximum distance in a direction parallel to the silicon substrate 1 between a portion of the blade 8 which is perpendicular to the surface of the silicon substrate 1 and an end portion of the blade 8 which cuts into the silicon substrate 1 in an inclined manner. The inclination is indicated by 'x' in FIG. 4A.

After the blade 8 was used for cutting the silicon substrate 1 free from the metal deposit 5, the side surfaces of the blade 8 were observed by a scanning electron microscope (SEM). As a result, substantially no silicon debris was found on the side surfaces of the blade 8.

Next, a process of cutting the silicon substrate 1 having the metal deposit 5 on the scribe lines 2 was performed and the influence on the blade 8 was observed.

In the experiment, a silicon substrate having an aluminum film with a thickness of about 1 μm formed thereon was used as the silicon substrate 1, and the silicon substrate 1 was cut under conditions similar to the conditions in the above-described process of cutting the silicon substrate free from the metal deposit 5. After the cutting process, the partial inclination of the blade 8 was measured by observing the scribe lines 2 in the silicon substrate 1 (see FIG. 4B). Thus, an amount by which the blade 8 was bent was evaluated.

As a result, it was found that the inclination x of the blade increased by about 5 μm each time a single scribe line 2 was cut. In other words, the inclination increased to 5 μm, 10 μm, 15 μm, . . . , as the silicon substrate 1 having the aluminum film formed thereon was continuously cut. In the above-described process of cutting the silicon substrate 1 free from the metal deposit 5, the inclination was no greater than about 10 μm after cutting 500 scribe lines 2. Thus, the inclination significantly increases in the case where the metal deposit 5 is provided on the silicon substrate 1.

This is probably due to the following reason. That is, when the blade 8 cuts into the region in which the metal deposit 5 made of aluminum or the like is formed, clogging of the blade 8 quickly progresses at the blade surface A having a relatively low cutting performance, and the blade surface A receives large cutting resistance. Due to the increase in the cutting resistance, a stress is applied to the blade surface A and the inclination of the blade 8 increases accordingly.

After the blade 8 was used for cutting the silicon substrate 1 having the aluminum film formed thereon, the side surfaces of the blade 8 were observed by the scanning electron microscope (SEM). As a result, a large amount of silicon debris was found on the side surface with a smaller amount of dressing (blade surface A in FIG. 4B). This is probably because the performance in discharging the debris from the cutting section was reduced due to the reduction in the cutting performance and the silicon debris remained and collected on the surface of the blade 8.

Thus, it can be assumed that when the blade 8 cuts into the region in which the metal deposit 5 is formed, clogging of the blade 8 quickly progresses at the blade surface A having a relatively low cutting performance, and the difference in cutting performance between the blade surfaces A and B increases accordingly. As a result, the inclination of the blade 8 increases. In addition, it is also possible that the silicon debris cannot be easily discharged due to the influence of malleability and ductility of the metal forming the metal deposit 5 on the surface of the silicon substrate 1 when the blade 8 cuts into the silicon substrate 1.

Figure 5:
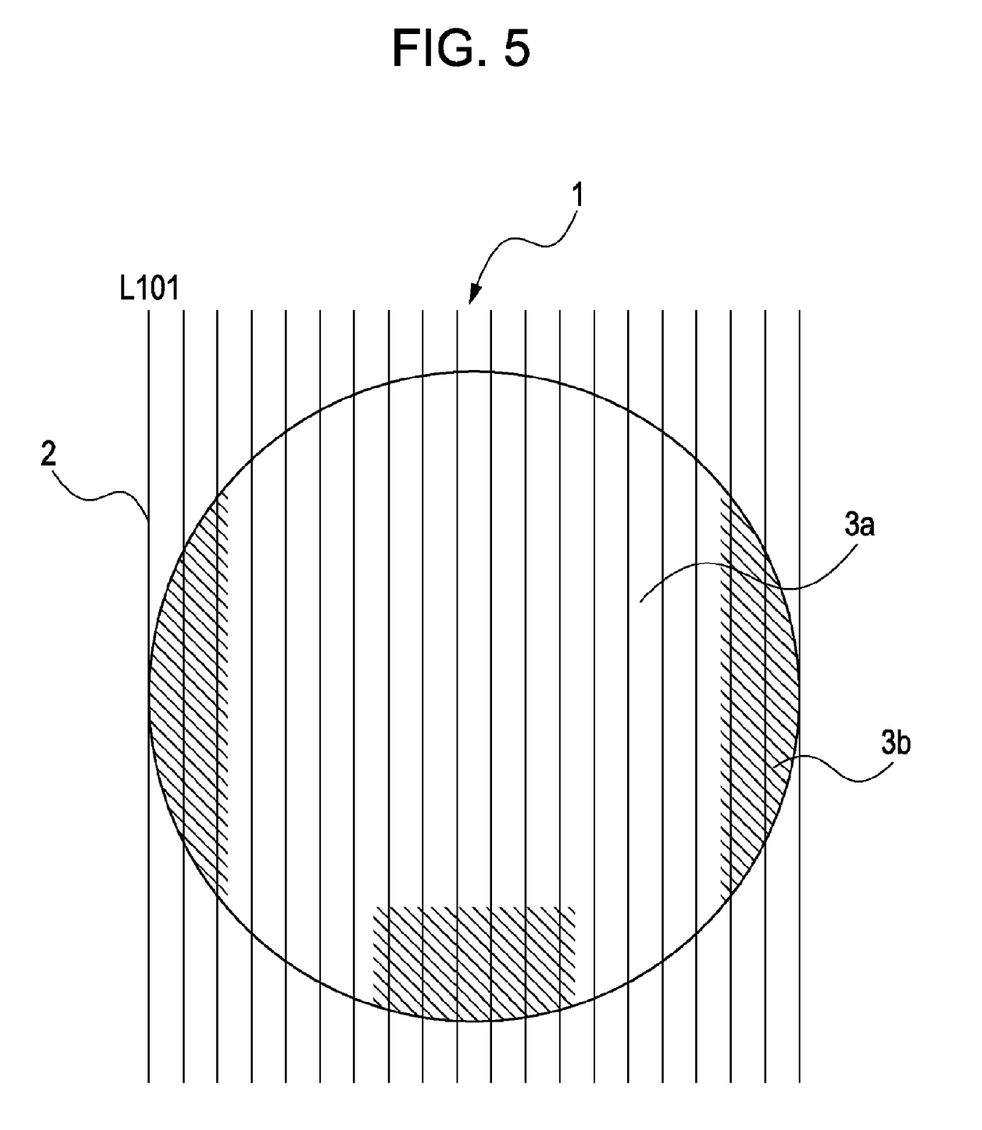
FIG. 5 is a schematic diagram illustrating a silicon substrate having areas in which metal deposit is provided on scribe lines and an area in which no metal deposit is provided on the scribe lines.

Next, another experiment was performed using the silicon substrate 1 shown in FIG. 5. Referring to FIG. 5, the silicon substrate 1 is a patterned 1.6-inch silicon substrate having an aluminum film with a thickness of about 1 μm formed thereon. A blade produced by DISCO Corporation (Model No. NBC-ZH205O) was used as the blade 8, and the rotational speed and the feed rate of the blade 8 were set to 45000 rpm and 30 mm/sec, respectively. The scribe lines 2 were successively cut from a scribe line L101. In the experiment, the end portion of the blade 8 was caused to cut into a dicing tape 7 by 35 μm, so that the rounded shape of the end portion of the blade 8 does not affect the flatness of the cut surfaces of chips.

As a result of measurement of the inclination of the blade 8, it was found that the inclination suddenly increased after about 50 scribe lines 2 were cut. This is probably because the blade 8 broke after cutting about 50 scribe lines 2.

Figure 6:
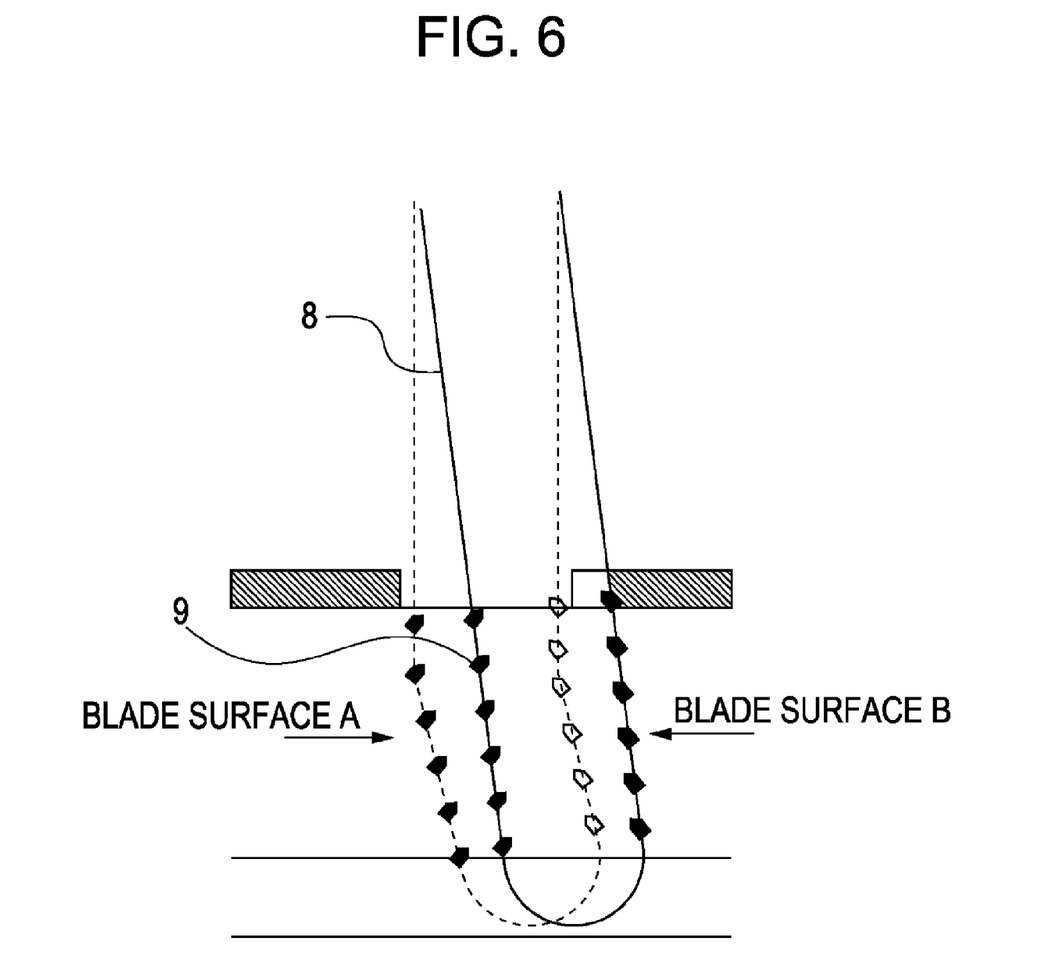
FIG. 6 is a schematic diagram illustrating the inclination of the blade when the blade is displaced from a scribe line.

In addition, it was also found that the position of the cut surfaces formed by the blade 8 were displaced from the scribe lines 2, as shown in FIG. 6, by the time at which the blade 8 broke. Each scribe line 2 includes a margin area so that the width of the scribe line 2 is larger than that of the blade 8. In the present embodiment, the inclination of the blade 8 at which the cut surfaces are displaced from the scribe line 2 including the margin area is determined as a critical value. While the inclination of the blade 8 is less than the critical value, the portion of the blade 8 which is not in contact with the silicon substrate 1 is not inclined, as described above, and only the portion of the blade 8 which cuts into the silicon substrate 1 is inclined. When the inclination of the blade 8 exceeds the critical value, the portion of the blade 8 which is not in contact with the silicon substrate 1 becomes inclined, as shown in FIG. 6. If the process of cutting the silicon substrate 1 is continued after the inclination exceeds the critical value, the blade 8 finally breaks.

Figure 7:
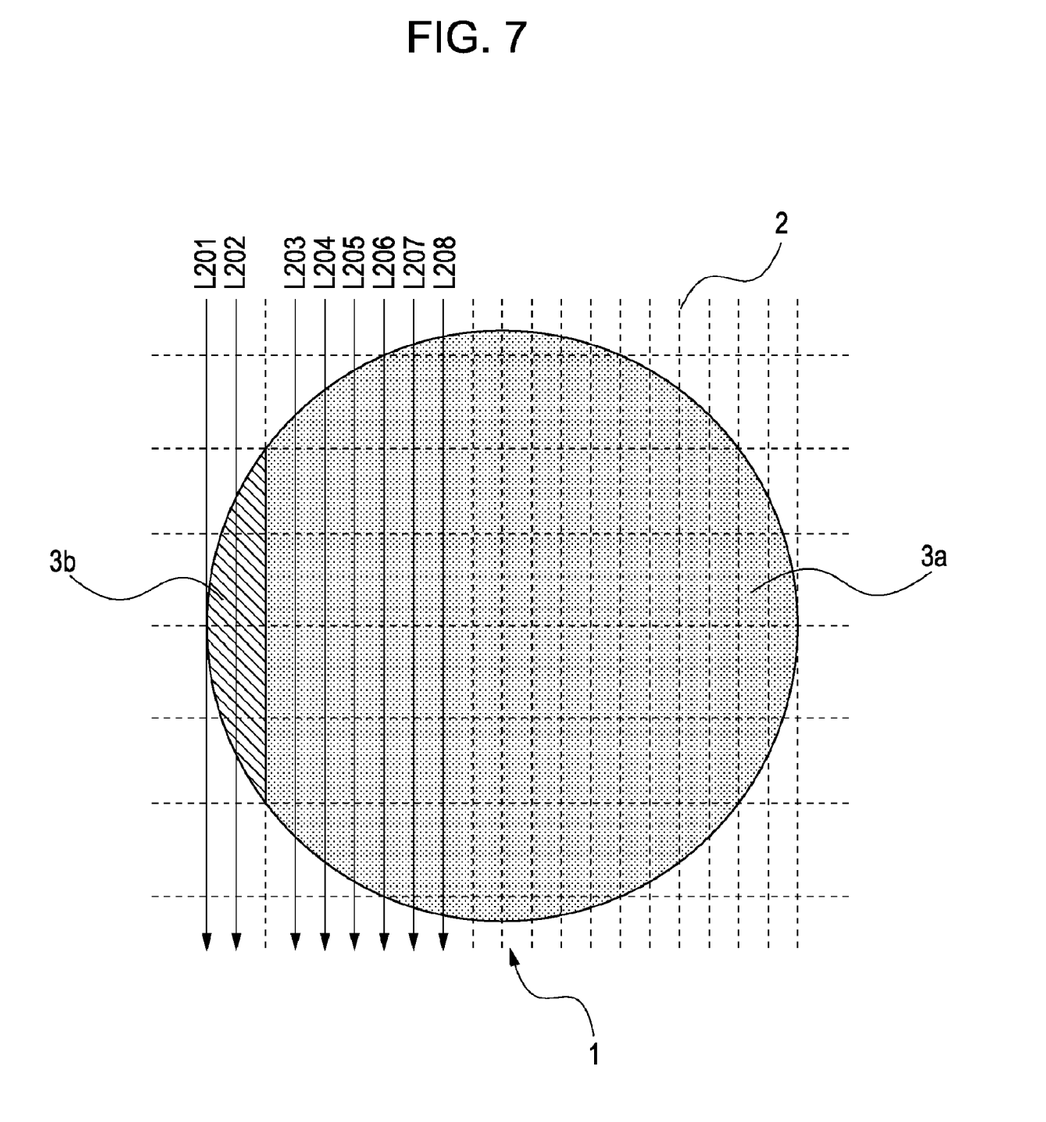
FIG. 7 is a schematic diagram illustrating the order in which the blade cuts into a silicon substrate having an area in which metal deposit is provided on scribe lines and an area in which no metal deposit is provided on the scribe lines.

Next, the following experiment was performed using the silicon substrate 1 shown in FIG. 7. As shown in FIG. 7, the silicon substrate 1 is a patterned silicon substrate having an aluminum film with a thickness of about 1 μm formed thereon.

A blade produced by DISCO Corporation (Model No. NBC-ZH205O) was used as the blade 8, and the rotational speed and the feed rate of the blade 8 were set to 45000 rpm and 30 mm/sec, respectively. In the experiment, the end portion of the blade 8 was caused to cut into a dicing tape 7 by 35 μm, so that the rounded shape of the end portion of the blade 8 does not affect the flatness of the cut surfaces of chips.

Figure 8:
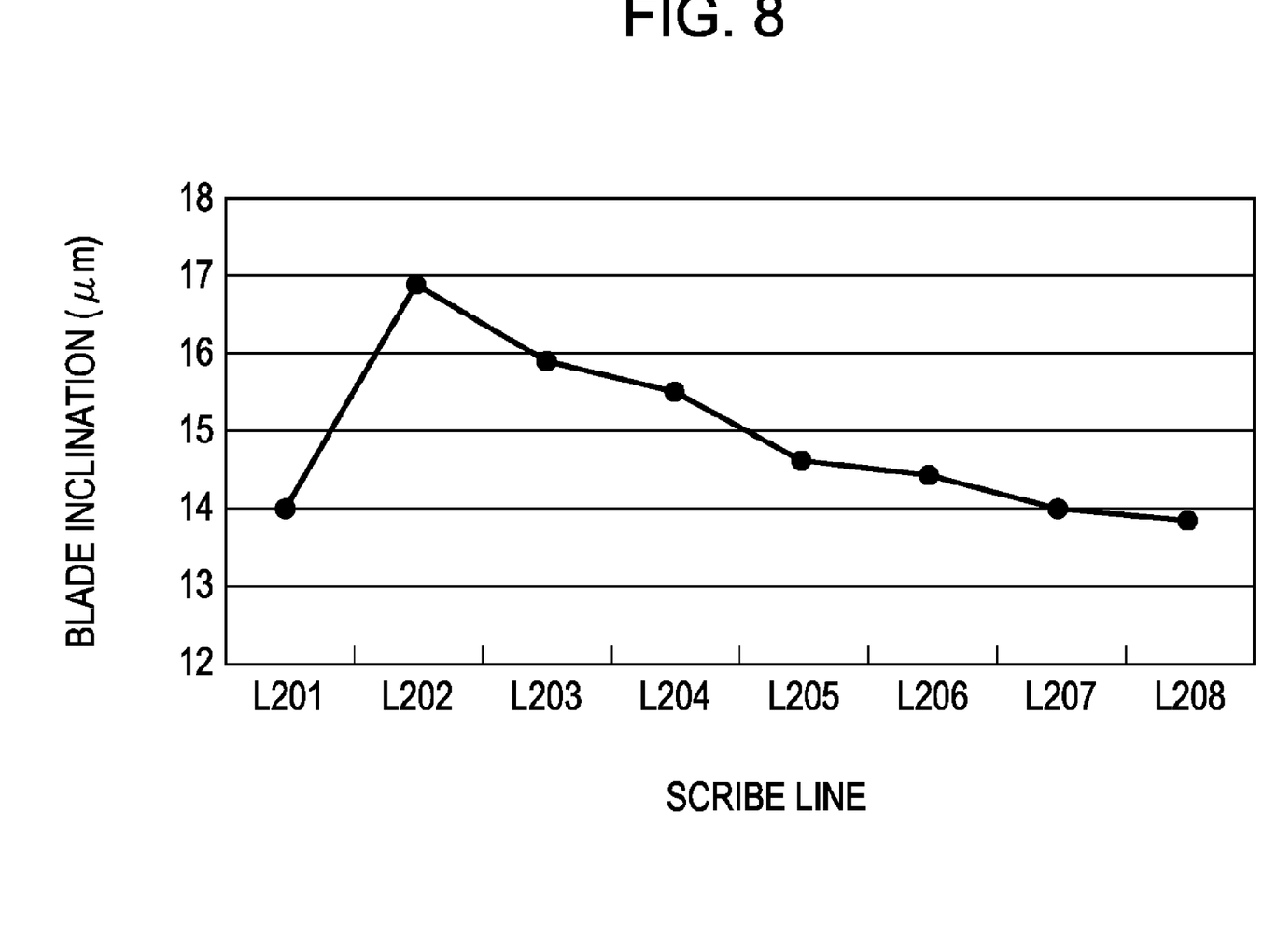
FIG. 8 is a result of measurement of the inclination of the blade.

First, a scribe line L201 on which aluminum was provided was cut, and the inclination of the blade 8 obtained by bringing the blade 8 in contact with the silicon substrate 1 was set as an initial inclination. Then, a scribe line L202 on which aluminum was provided was cut, and then a scribe line L203 which was free from aluminum was cut. Then, the scribe lines L204 to L208 were successively cut. FIG. 8 shows the inclination of the blade 8 obtained by observing the scribe lines L201 to L208. From this result, it was found that the inclination of the blade 8 caused by cutting the scribe lines L201 and L202 having aluminum provided thereon can be reduced to the initial inclination by cutting the scribe lines L203 to L208.

This is probably because although the silicon debris clogs on the blade surface with a lower amount of dressing when the blade 8 cuts into the scribe lines 2 having the metal deposit 5 provided thereon, the silicon debris can be removed when the blade 8 cuts into the scribe lines 2 free from the metal deposit 5.

Thus, although the cutting performance is reduced when the blade 8 cuts into the scribe lines 2 having the metal deposit 5 provided thereon, the cutting performance can be restored by cutting the scribe lines 2 free from the metal deposit 5.

From the above-described experiments, it was found that the reduction in the cutting performance, in particular, the increase in the inclination of the blade 8 which leads to the breakage of the blade 8, can be suppressed by cutting the scribe lines 2 free from the metal deposit 5 before the inclination of the blade 8 excessively increases, that is, before the inclination reaches the critical value. The metal deposit 5 which affects the inclination of the blade 8 is not limited to aluminum as described above, and can also be other kinds of metal, such as gold, platinum, and silver, which have malleability and ductility. In addition, the substrate to be cut is not limited to the silicon substrate 1, and can also be a glass substrate or other types of substrates.

Next, a system for automatically recovering the cutting performance of the blade 8 will be described. In this system, a process of cutting a silicon substrate having metal deposit formed thereon in the same pattern as the metal deposit 5 on the silicon substrate 1 to be cut is performed in advance, and the critical value peculiar to the silicon substrate 1 and the blade 8 is determined.

First, a system for recovering the cutting performance according to a first embodiment will be described.

In this system, the process of cutting a silicon substrate having metal deposit formed thereon in the same pattern as the metal deposit 5 on the silicon substrate 1 to be cut is performed in advance, and the critical value peculiar to the silicon substrate 1 and the blade 8 is determined. Here, the "same pattern" means that the silicon substrates have the same distribution of the region in which the metal deposit is provided and the region free from the metal deposit. The critical value is determined such that there is a predetermined allowance before the blade 8 actually breaks. In other words, the critical value is set to a value smaller than the inclination of the blade surfaces at the time when the blade 8 actually breaks.

Then, the silicon substrate 1 is cut along the scribe lines 2 with the blade 8, and images of cross sections of the scribe lines in the silicon substrate 1, for example, images similar to those shown in FIGS. 3A to 4B, are obtained using an image capturing device, such as a vide camera, from the front in the direction in which the blade is moved. The process of obtaining the images can be performed each time a single scribe line 2 is cut or each time two or more scribe lines 2 are cut.

Figure 4B:
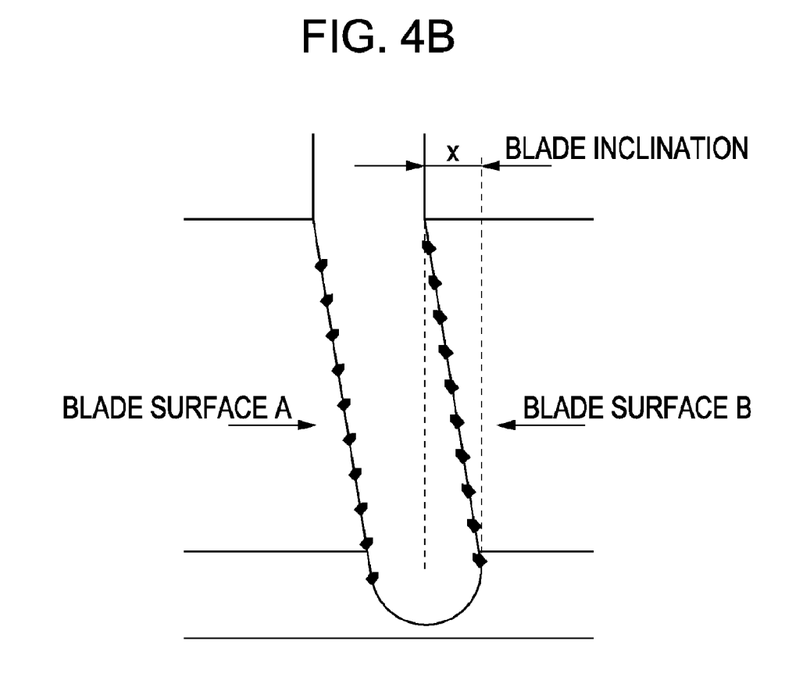

Next, the thus-obtained images are subjected to a pattern recognition process and inclinations of the lines cut by the blade 8 are determined in terms of the value x shown in FIGS. 4A and 4B. Each of the thus-obtained inclinations is compared with the critical value determined in advance, and the cutting process is continuously performed unless the inclination exceeds the critical value. If the inclination becomes equal to or higher than the critical value, one of the scribe lines 2 free from the metal deposit 5 is cut instead of cutting the next scribe line 2 which has the metal deposit 5 provided thereon. Accordingly, the amount by which the blade 8 is bent can be reduced from that at the time when the blade 8 was used to cut the scribe lines 2 having the metal deposit 5 provided thereon. The process of cutting the scribe line 2 free from the metal deposit 5 to recover the cutting performance is continued until it is confirmed that the inclination of the blade surfaces is at least lower than the critical value by the above-described method using the image capturing device. The process can be continued until the inclination is sufficiently reduced.

Then, the normal cutting step is performed again and the scribe lines 2 having the metal deposit 5 formed thereon are cut.

Next, a system for recovering the cutting performance according to a second embodiment will be described.

Figure 9:
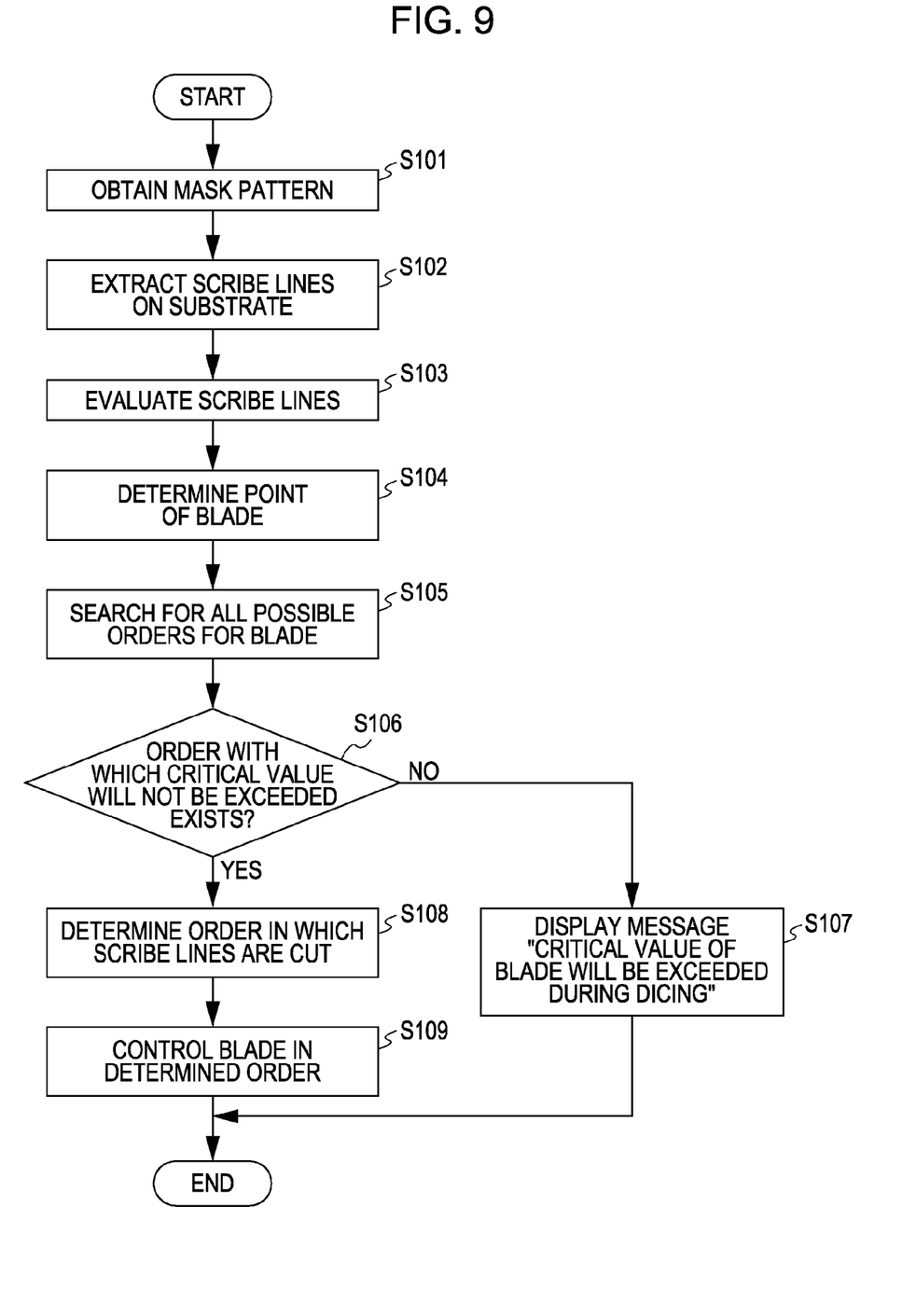
FIG. 9 is a flowchart of a system for restoring the cutting performance of the blade.
Figure 10:
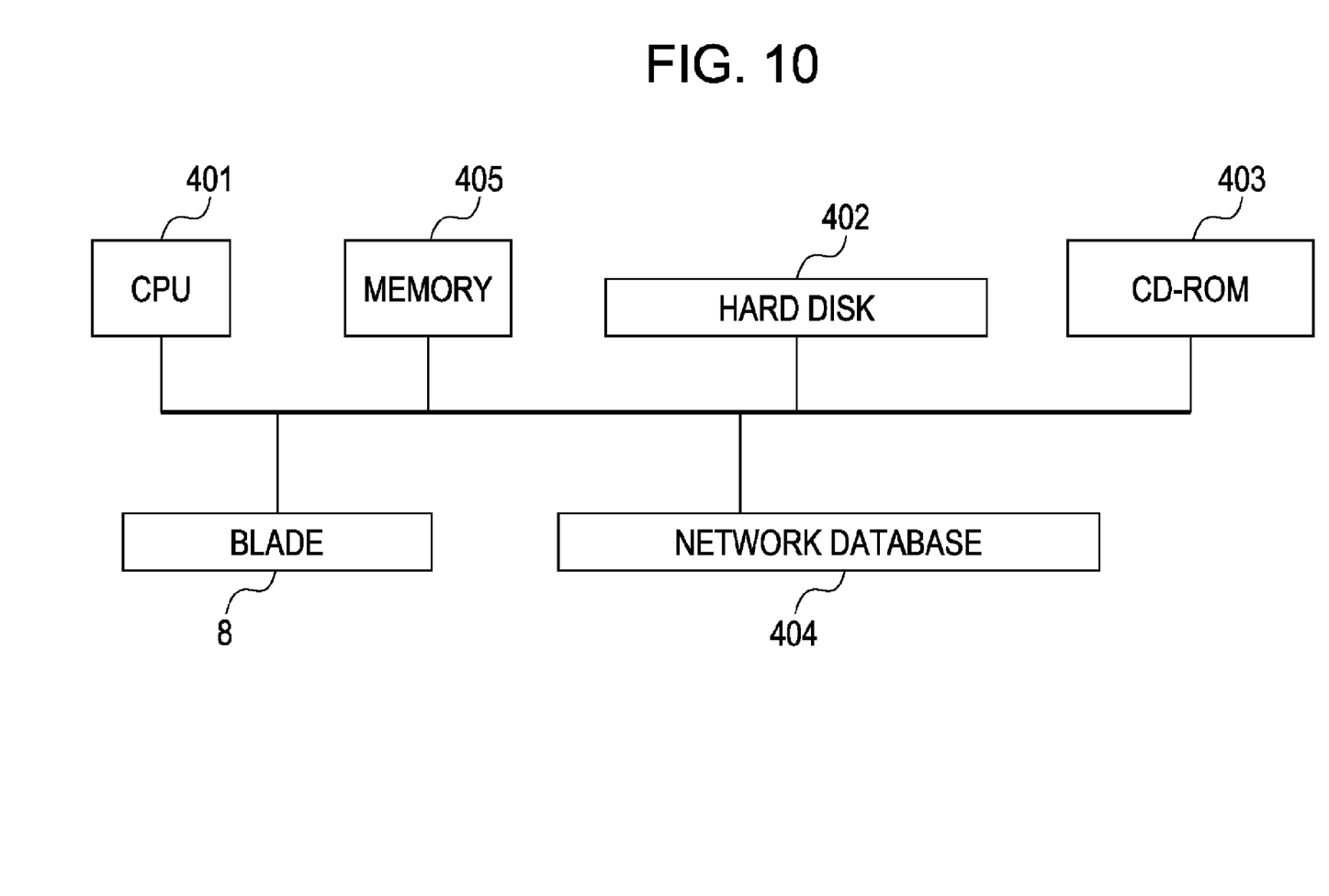
FIG. 10 is a schematic diagram illustrating the structure of the system.

FIG. 9 is a flowchart of a program for causing a CPU 401 to execute an operation according to the system of the second embodiment. FIG. 10 is a schematic diagram illustrating the structure of the system.

Referring to FIG. 10, the CPU 401 receives a mask pattern of the silicon substrate 1 to be subjected to dicing (to be cut) and a critical value of the blade 8 from a hard disk 402 in step S101. As described above, the critical value, which is peculiar to the silicon substrate 1 and the blade 8, is determined in advance. More specifically, the critical value is determined by performing a process of cutting a silicon substrate having metal deposit formed thereon in the same pattern as the metal deposit 5 on the silicon substrate 1 to be cut. In this process, a blade of the same type as the blade 8 to be used in the process of cutting the silicon substrate 1 is used. The mask pattern and the critical value of the blade 8 can be obtained from the hard disk 402 in which these data are stored. Alternatively, the data can be obtained from a storage medium, such as a CD-ROM 403, or from a database 404 through a network. The thus-obtained critical value is temporarily stored in a memory 405.

The CPU 401 analyzes the mask pattern obtained in step S101, and extracts a pattern of the scribe lines 2 on the silicon substrate 1 in step S102.

Figure 11:
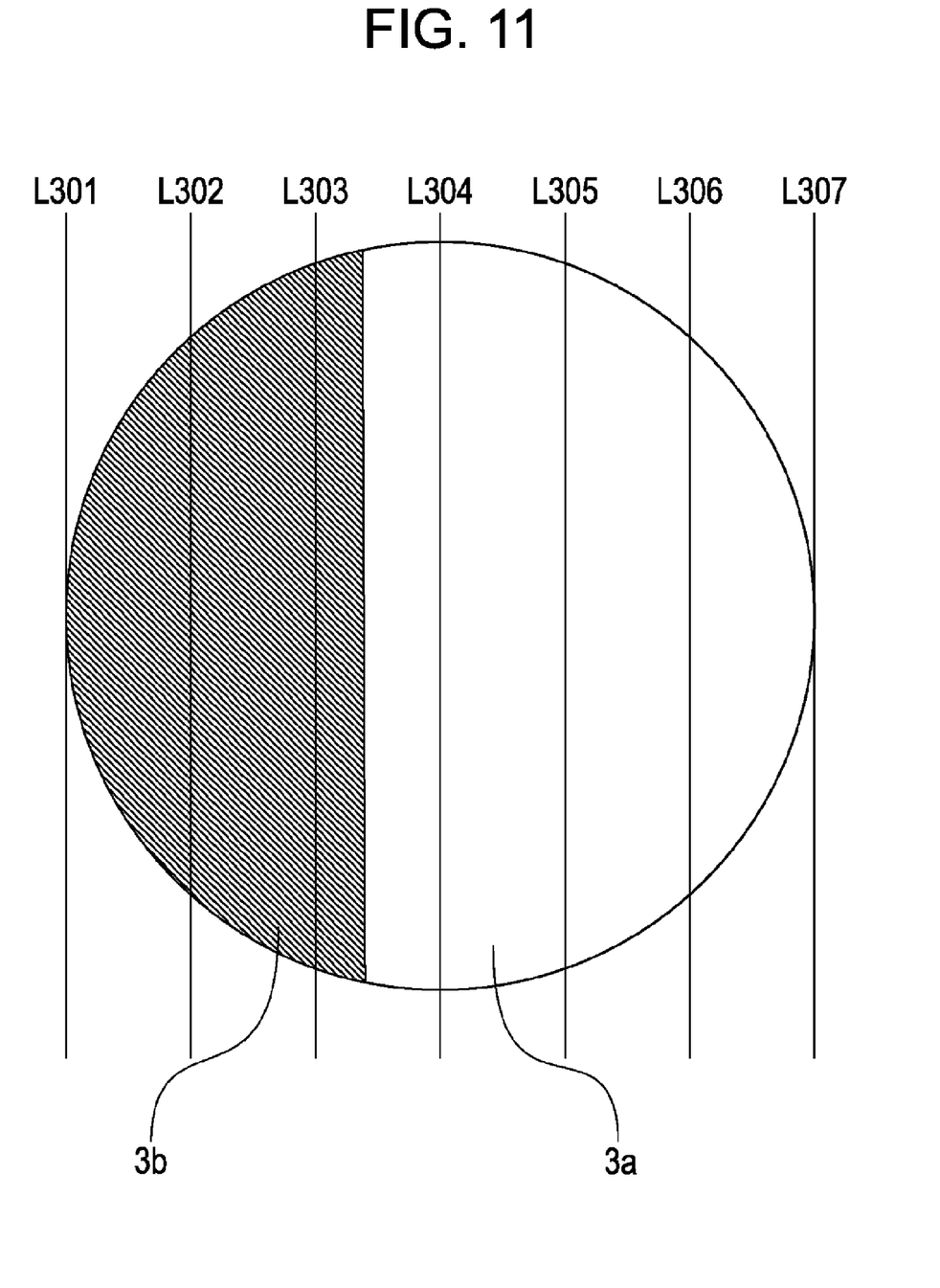
FIG. 11 is a diagram illustrating an example of a mask pattern.

The relationship between the above-described mask pattern and the silicon substrate 1 will be describe with reference to an example. Referring to FIG. 11, the mask pattern corresponds to a pattern of a resist layer used for removing the metal deposit by etching. The resist layer is formed on the metal deposit applied to the silicon substrate 1. The resist layer exists in an area 3b (non-exposed area), and is absent in the remaining area 3a (exposed area). The pattern of the resist layer functions as a mask pattern in the etching process for removing the metal deposit. Therefore, the shape of the pattern of the resist layer corresponds to the shape of the pattern of the metal deposit. The shape of the pattern of the resist layer on the substrate is obtained as the information regarding the mask pattern in step S101. Then, in step S102, information regarding the pattern of the metal deposit on the substrate after the etching process is determined on the basis of the information obtained in step S101.

When the pattern of the resist layer for etching the metal deposit is obtained, the exposed area 3a and the unexposed area 3b are formed. In the process of forming the pattern of the resist layer, a mask (reticle) disposed in the exposure device is used to subject the resist layer to exposure. The pattern of this mask (reticle) also corresponds to the mask pattern. The shape of the mask included in the exposure device determines the pattern of the resist layer, and the pattern of the resist layer determines the pattern of the metal deposit on the substrate. Therefore, the information regarding the mask in the exposure device corresponds to the pattern of the metal deposit.

In step S103, the CPU 401 evaluates each of the scribe lines 2 on the basis of the information of the scribe lines 2 extracted in step S102. More specifically, the CPU 401 evaluates the scribe lines 2 by determining points for the scribe lines 2 on the basis of the thickness of the metal deposit 5 on each scribe line 2 and the length of the metal deposit 5 along the scribe line 2. For example, in the mask pattern shown in FIG. 11, the CPU 401 determines the point of a scribe line L301 as −2, the point of a scribe line L302 as −5, and the point of a scribe line L303 as −9. Similarly, the CPU 401 determines the point of a scribe line L304 as +7, the point of a scribe line L305 as +5, the point of a scribe line L306 as +3, and the point of a scribe line L307 as +1. The thus-determined points are temporarily stored in the memory 405.

After the scribe lines are evaluated and the points thereof are determined in step S103, the CPU 401 evaluates the blade 8 in step S104. For example, in the case where the mask pattern shown in FIG. 11 is used, a point of the blade 8 in the state before the blade 8 cuts into the silicon substrate 1 is provisionally set to 10. The point of the blade 8 in this state is stored in the memory 405. The point of the blade 8 is determined by the CPU 401 such that the point does not exceed the initial point 10. For example, even if the blade 8 cuts into the substrate along the scribe line L304 first, the CPU 401 does not determine that the point of the blade 8 is increased to 17, but determines that the point of the blade 8 is maintained at 10.

The CPU 401 searches for all possible orders in which the silicon substrate 1 can be cut along the scribe lines 2 on the basis of the information obtained in steps S103 and S104. For each of the orders, the CPU 401 successively adds the points of the scribe lines 2 determined in step S103 to the point of the blade 8 determined in step S104, and stores the variation in the point of the blade 8 in the memory 405. Then, in step S105, the CPU 401 checks the variation in the point of the blade 8 stored in the memory 405 and determines the minimum value thereof for each of the orders. Referring to FIG. 11, the minimum value determined by the CPU 401 differs depending on the order in which the scribe lines 2 are cut.

Then, in step S106, it is determined whether or not there is an order for which the minimum value is greater than the point corresponding to the critical value stored in the memory 405. If there is no order for which the minimum value is greater than the point corresponding to the critical value, the process proceeds to step S107. If there is an order for which the minimum value is greater than the point corresponding to the critical value, the process proceeds to step S109.

If it is determined in step S106 that there is no order for which the minimum value is greater than the point corresponding to the critical value, the CPU 401 displays a message "Critical value will be exceeded during dicing" in step S107. Then, the process is ended.

If it is determined in step S106 that there is an order for which the minimum value is greater than the point corresponding to the critical value, that order is determined as the order to be used in step S108. For example, in the case where the mask pattern shown in FIG. 11 is used and the point corresponding to the critical value is 0, the minimum value of the point of the blade 8 is greater than 0 when the scribe lines are cut in the order of L301, L302, L304, L303, L305, L306, and L307. In this case, the minimum value of the point of the blade 8 is 1.

In step S109, the CPU 401 controls the blade 8 so that the blade 8 cuts into the scribe lines 2 in the order determined in Step S108.

In the above-described embodiment, the substrate shown in FIG. 11 is cut in a single direction. However, the present invention can be applied irrespective of the direction in which the substrate is cut. In addition, in the above-described embodiment, the point of each scribe line 2 is determined on the basis of the thickness of the metal deposit 5 on the scribe line 2 and the length of the metal deposit 5 along the scribe line 2. However, the point can also be determined by other methods. For example, the points of the scribe lines 2 can be simply determined such that the point of each scribe line 2 with the metal deposit 5 provided thereon is −5 and the point of each scribe line 2 free from the metal deposit 5 is 3. In addition, if there are a plurality of orders for which the minimum value of the points of the blade 8 is larger than the point corresponding to the critical value, the order with the largest minimum value, for example, can be used. Alternatively, the order can be selected in consideration of the amount of movement of the blade 8.

The steps in the systems for recovering the cutting performance according to the first and second embodiments can be provided as a program for the CPU which controls the system operation. In addition, the steps can also be provided as a storage medium which stores the program as data.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-163635 filed Jun. 23, 2008, which is hereby incorporated by reference herein in its entirety.

What is claimed is:

1. A dicing method comprising:
   providing a substrate including a scribe line having a metal film thereon and a scribe line free from the metal film; and
   starting a process of cutting the substrate with a blade along the scribe line having the metal film;
   checking to see whether a bending amount of the surface of the blade reaches a critical value,
   wherein cutting the substrate along the scribe line having the metal film is continued if the bending amount has not reached the critical value,
   wherein cutting the substrate along the scribe line having the metal film is stopped and cutting the substrate along the scribe line free from the metal film is started if the bending amount has reached the critical value, and,
   wherein the critical value is set to a value which leads to a breakage of the blade and which is smaller than an inclination of the blade surface at a time when the blade breaks.

2. The dicing method according to claim 1, wherein the metal film includes aluminum.

3. The dicing method according to claim 1, wherein the metal film includes one of gold, platinum and silver.

4. The dicing method according to claim 1, wherein the metal film is formed by one of painting, plating and depositing.

5. The dicing method according to claim 4, wherein the metal film has a thickness of approximately 1 μm.

* * * * *